United States Patent [19]

Hayakawa et al.

[11] Patent Number: 4,899,349
[45] Date of Patent: Feb. 6, 1990

[54] SEMICONDUCTOR LASER DEVICE

[75] Inventors: Toshiro Hayakawa, Nara; Takahiro Suyama, Tenri; Kohsei Takahashi, Tenri; Masafumi Kondo, Tenri; Saburo Yamamoto, Haibara, all of Japan

[73] Assignee: Sharp Kabushiki Kaisha, Osaka, Japan

[21] Appl. No.: 285,342

[22] Filed: Dec. 14, 1988

Related U.S. Application Data

[63] Continuation of Ser. No. 885,920, Jul. 15, 1986, abandoned.

[30] Foreign Application Priority Data

Jul. 18, 1985 [JP] Japan ................... 60-160941

[51] Int. Cl.$^4$ ............................................. H11S 3/19
[52] U.S. Cl. ................................. 372/44; 372/46
[58] Field of Search ........................... 372/45, 46, 44

[56] References Cited

U.S. PATENT DOCUMENTS

| | | | |
|---|---|---|---|
| 4,190,813 | 2/1980 | Logan et al. | 372/45 |
| 4,644,551 | 2/1987 | Kawano et al. | 372/46 |
| 4,694,460 | 9/1987 | Hayakawa et al. | 372/45 |
| 4,694,461 | 9/1987 | Yano et al. | 372/45 |
| 4,706,254 | 10/1987 | Nojiri et al. | 372/46 |
| 4,723,253 | 2/1988 | Hayakawa et al. | 372/46 |
| 4,740,976 | 4/1988 | Kajimura et al. | 372/45 |

FOREIGN PATENT DOCUMENTS 55-111191 of 1980 Japan .
56-98889 of 1981 Japan .
60-45086 of 1985 Japan .

OTHER PUBLICATIONS

Amann, *Archiv fur Electronic und Ubertragungste chnik* 39(5): 311–316 (1985).
Kawaguchi et al., *IEEE Journal of Quantum Electronics* QE-13(8): 556–560 (1977).
Kaminow et al., *Electronics Letters* 17(9):318–320 (1981).

*Primary Examiner*—Frank Gonzalez
*Attorney, Agent, or Firm*—Irell & Manella

[57] ABSTRACT

A double-heterostructure multilayered crystal structure in a semiconductor laser device contains an active layer for laser oscillation. A striped etching-protective thin layer is formed on the double-heterostructure multilayered crystal. A striped-mesa multilayered crystal is formed on the striped etching-protective thin layer. A burying layer is formed on the double-heterostructure multilayered crystal outside of both the striped thin layer and striped-mesa multilayered crystal. This provides refractive index distributions within the active layer corresponding to the inside and the outside of the striped-mesa multilayered crystal. Further, it provides a striped structure which functions as a current path composed of the striped-mesa multilayered crystal.

5 Claims, 2 Drawing Sheets

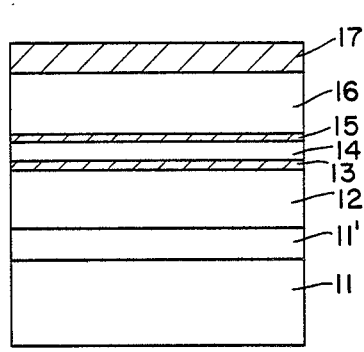
FIG. IA
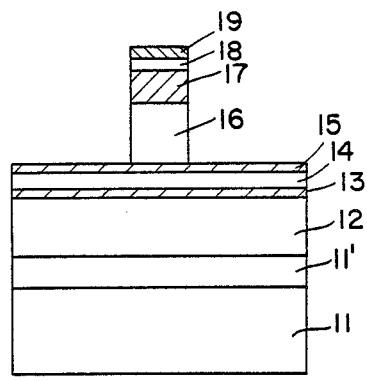
FIG. IB
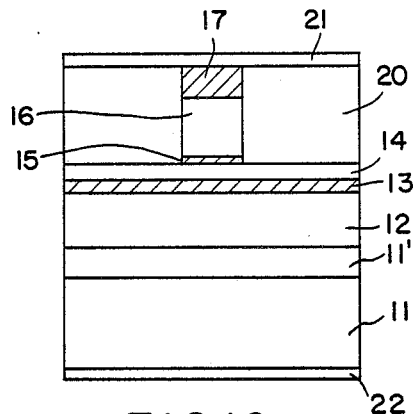
FIG. IC

SEMICONDUCTOR LASER DEVICE

This application is a continuation of application Ser. No. 885,920, filed July 15, 1986, now abandoned.

BACKGROUND OF THE INVENTION

1. Field of the invention:

This invention relates to a semiconductor laser device. More particularly, it relates to a semiconductor laser device having a structure which is effective to control a transverse mode of laser oscillation, to lower the threshold current level and to increase the life span, and which is produced by the use of a crystal growth technique for the formation of ultra-thin films such as molecular beam epitaxy (MBE) or metal-organic chemical vapor deposition (MO-CVD).

2. Description of the prior art:

Recently, a single crystal growth technique for the formation of thin films such as molecular beam epitaxy (MBE), metal-organic chemical vapor deposition (MO-CVD), etc., has been developed which enables the formation of thin film growth layers having a thickness of as thin as approximately 10 Å. The development of such a technique, although these significantly thin films have not yet been produced by liquid phase epitaxy (LPE), allowed the thin films to be applied to lasers, resulting in laser devices exhibiting new laser effects and/or superior laser characteristics. A typical example of these new laser devices is a quantum well (QW) laser, which is produced based on the fact that quantization levels are established in its active layer by reducing the thickness of the active layer from several hundred 521 to approximately 100 Å or less and which is advantageous over conventional double heterostructure lasers in that the threshold current level is low and the temperature and transient characteristics are superior. Such a quantum well laser is described in detail in the following papers:

(1) W. T. Tsang, Applied Physics Letters, vol. 39, No. 10, pp. 786 (1981), (2) N. K. Dutta, Journal of Applied Physics, vol. 53, No. 11, pp. 7211 (1982), and (3) H. Iwamura, T. Saku, T. Ishibashi, K. Otsuka, Y. Horikoshi, Electronics Letters, vol. 19, No. 5, pp. 180 (1983).

As mentioned above, the single crystal growth technique, such as molecular beam epitaxy or metal-organic chemical vapor deposition, has resulted in the practical use of high quality semiconductor lasers having a new multiple-layered structure. However, the semiconductor laser is deficient in that a stabilized transverse mode of laser oscillation cannot be attained due to its multiple-layered structure.

One of the most important points requiring improvement in other conventional semiconductor lasers which are in practical use is stabilization of the transverse mode of laser oscillation. A contact stripe geometric laser, which was developed in the early stage of laser development, has a striped electrode to prevent injected current from transversely expanding, and attains laser oscillation in a zero order mode (i.e., a fundamental transverse mode) upon exceeding the threshold current level due to the fact that gain required for laser oscillation is greater than losses within the active region underneath the stripe region, while the said contact stripe geometric laser produces laser oscillation in an expanded transverse mode or a higher-order transverse mode with an increase in the injection of current beyond the threshold current level, because carriers which are injected into the active layer spread to the outside of the striped region resulting in expanding the high gain region. Due to such an unstable transverse mode and dependency of the transverse mode on the amount of injected current, the linear relationship between the injected current and the laser output decreases. Moreover, the laser output resulting from pulse modulation is unstable so that the signal-noise ratio is reduced and its directivity becomes too unstable to be used in an optical system such as optical fibers, etc. In order to overcome the above-mentioned practical drawbacks of contact stripe geometric lasers, a variety of structures for semiconductor lasers of GaAlAs and/or InGaAsP systems have been already produced by liquid phase epitaxy, which prevent not only current but also light from transversely expanding thereby attaining stabilization in the transverse mode. However, most of these semiconductor lasers can only be produced by the growth of thin film layers on a channeled substrate, a mesa substrate or a terraced substrate based on a peculiarity of liquid phase epitaxy, typical examples of which are channeled substrate planar structure injection lasers (CSP lasers) (K. Aiki, M. Nakamura, T. Kuroda and J. Umeda, Applied Physics Letters, vol. 30, No. 12, pp. 649 (1977)), constricted double heterojunction lasers (CDH lasers) (D. Botez, Applied Physics Letters, vol. 33, pp. 872 (1978)) and terraced substrate lasers (TS lasers) (T. Sugino, M. Wada, H. Shimizu, K. Itoh, and I. Teramoto Applied Physics tters vol 34, No. 4, (1979)). All of these lasers can be only produced utilizing anisotrophy of the crystal growth rate, but they cannot be produced by the use of a crystal growth technique such as molecular beam epitaxy (MBE) or metal-organic chemical vapor deposition (MO-CVD).

FIG. 3 shows a conventional GaAlAs semiconductor laser operating in a stabilized transverse mode, which is produced as follows: On an n-GaAs substrate 1, an n-GaAs buffer layer 1', an n-$Ga_{0.7}Al_{0.3}As$ cladding layer 2, an n-GaAs active layer 3, a p-$Ga_{0.7}Al_{0.3}As$ cladding layer 4, and a p-GaAs cap layer 5 are successively formed by molecular beam epitaxy, followed by subjecting to a vapor deposition treatment with metal materials of Al/Zn/Au in this order to form an electrode layer 25, which is then formed into a striped shape by photolithography. The semiconductor layers positioned outside of the striped electrode layer 25 is then eliminated by an $Ar^+$ ion-beam etching technique using the striped electrode layer 25 as a masking material in such a manner that the thickness of the cladding layer 4 becomes approximately 0.3 μm, resulting in an optical waveguide within the active layer 3 corresponding to the striped region 10. The electrode layer 25 is subjected to a heating treatment to be alloyed. On the cladding layer 4 outside of the striped region 10, a $SiO_2$ film 6 and a p-sided Gr/Au electrode 8 are then formed. An n-sided AuGe/Ni electrode 7 is formed on the back face of the substrate 1, resulting in a laser device having relatively stabilized characteristics. However, this laser device is disadvantageous in that since the built-in refraction index difference of the optical waveguide depends upon precision of the depth of the semiconductor lasers to be etched by an $Ar^{30}$ ion-beam etching technique, it is difficult to control the built-in refraction index difference, causing difficulty in obtaining a fundamental transverse mode oscillation with reproducibility, and/or that since a decrease in the refraction index difference is difficult, high output power cannot be created.

Moreover, this laser device has the significant drawback mentioned below: This laser device is mounted on a radiation plate of Cu, etc., by means of a soldering material such as In, etc., in order to improve heat-radiation of the laser device. However, the distance from the portions of the active layer 3 corresponding to the regions other than the striped region 10 to the mounting face of the radiation plate is as extremely small as 1 μm or less, so that the active layer undergoes great stress due to thermal shrinkage based on a decrease in temperature after solidification of the soldering material, which makes the life span of the device short (T. Hayakawa et al., Appl. Phys. Lett., vol. 42, pp. 23 (1983)). In addition, the distance between the active layer and the mounting face corresponding to the striped region 10 is different from the distance therebetween corresponding to the regions other than the striped region 10, so that the active layer further undergoes great stress at the interface between these regions at the different distances, which accelerates deterioration of the device.

SUMMARY OF THE INVENTION

The semiconductor laser device of this invention, which overcomes the above-discussed and numerous other disadvantages and deficiencies of the prior art, comprises a double-heterostructure multi-layered crustal containing an active layer for laser oscillation, a striped etching-protective thin layer formed on said double-heterostructure multi-layer crystal, a striped-mesa multi-layered crystal formed on said striped etching-protective thin layer, and a burying layer formed on said double-heterostructure multi-layered crystal outside of both the striped thin layer and the striped-mesa multi-layered crystal, thereby providing refractive index distributions within said active layer corresponding to the inside and the outside of said striped-mesa multi-layered crystal and providing a striped structure functioning as a current path composed of said striped-mesa multi-layered crystal.

Thus, the invention described herein makes possible the objects of (1) providing a semiconductor laser device which is produced by a layer-thickness control technique attained by molecular beam epitax and/or metal-organic chemical vapor deposition; (2) providing a semiconductor laser device which operates at a low threshold current level in a stabilized transverse mode; and (3) providing a semiconductor laser device which operates with high reliability for a long period of time.
pcl BRIEF DESCRIPTION OF THE DRAWINGS This invention may be better understood and its numerous objects and advantages will become apparent to those skilled in the art by reference to the accompanying drawings as follows:

FIGS. 1(A), 1(B) and 1(C) are diagrams showing a process for the production of a semiconductor laser device of this invention.

DESCRIPTION OF THE PREFERRED EMBODIMENTS

Figure 2:
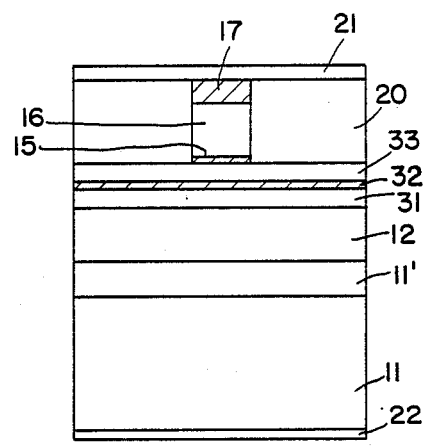
FIG. 2 is a front sectional view showing another semiconductor laser device of this invention.
Figure 3:
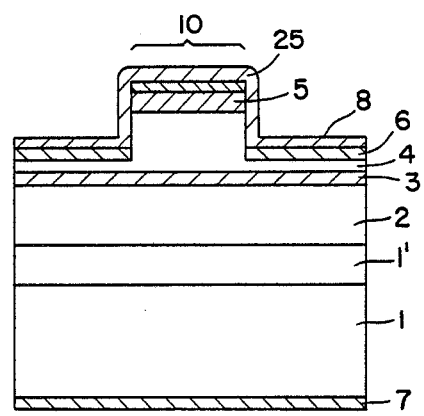
FIG. 3 is a front sectional view showing a conventional semiconductor laser device produced by molecular beam epitaxy.

The semiconductor laser device of this invention attains stabilization of a transverse mode by utilizing an etching-protective layer and a surface-protective thin layer. Moreover, crystal growth of burying layers is selectively carried out in the regions other than the striped mesa region, resulting in the wafer having a flat surface, and thus the distance between the active layer and the mounting face of a radiation plate, on which the laser device is mounted, can be equal to be 1 μm or more in the whole region containing the striped region, thereby attaining a lowering of stress to be imposed on the active layer.

EXAMPLE 1

FIGS. 1(A), 1(B) and 1(C) show a production process of the semiconductor laser device of this invention, which is produced as follows: On an n-GaAs substrate 11, an n-GaAs buffer layer 11' having a thickness of 0.5 μm, an n-Al$_{0.5}$Ga$_{0.5}$As cladding layer 12 having a thickness of 1.0 μm, a non-doped GaAs active layer 13 having a thickness of 0.07 μm, a p-Al$_{0.5}$Ga$_{0.5}$As cladding layer 14 having a thickness of 0.2 μm, a p-GaAs etching-protective layer 15 having a thickness of 0.005 μm, a p-Al$_{0.5}$Ga$_{0.5}$As cladding layer 16 having a thickness of 1.5 μm, and a p-GaAs cap layer 17 having a thickness of 0.5 μm are sucessively formed by molecular beam epitaxy, as shown in FIG. 1(A), resulting in a double-heterostructure multi-layered crystal for laser oscillation. Then, a Si$_3$N$_4$ film 18 is formed on the cap layer 17 by plasma assisted chemical vapor deposition. Then, a photoresist 19 is formed into a stripe on the Si$_3$N$_4$ film 18 by photolithography as shown in FIG. 1(B), followed by subjection to an HCl treatment to form the Si$_3$N$_4$ film 18 into a stripe. Then, the regions of the above-mentioned multi-layered crystal outside of the striped Si$_3$N$_4$ film 18 are etched to a depth of approximately 1 μm by an etchant containing sulfuric acid (e.g., H$_2$SO$_4$:H$_2$O$_2$:H$_2$O=10:1:1). Then, by the use of an etchant of hydrofluoric acid which selectively etches the Al$_{0.5}$Ga$_{0.5}$As crystal but does not etch the GaAs crystal, the remaining p-Al$_{0.5}$Ga$_{0.5}$As layer outside of the striped portion is etched in a manner to reach the GaAs etching-protective layer 15.

Then, the photoresist 19 positioned at the striped portion is removed, and an n-Al$_{0.8}$Ga$_{0.2}$As burying layer 20 having a thickness of 2 μm is formed on the GaAs etching-protective layer 15 outside of the striped portion by liquid phase epitaxy as shown in FIG. 1(C). The GaAs etching-protective layer 15 exposed to the outside is melted back into the Ga-fused solution at the beginning of the crystal growth of the burying layer 20 by liquid phase epitaxy and functions as a surface-protective layer for protecting the Al$_{0.5}$Ga$_{0.5}$As cladding layer 14 positioned below the etching-protective layer 15, so that the Al$_{0.8}$Ga$_{0.2}$As burying layer 20 to be epitaxially grown on the Al$_{0.5}$Ga$_{0.5}$As cladding layer 14 can be of a good quality. Then, the Si$_3$N$_4$ film 18 at the striped portion is removed. A p-sided Au/Zn electrode 21 is formed on the whole upper faces of both the cap layer 17 and the burying layer 20 and an n-sided AuGe/Ni electrode 22 is formed on the back face of the GaAs substrate 11, followed by cleaving at both facets, resulting in a semiconductor laser device.

EXAMPLE 2

FIG. 2 shows another semiconductor laser device of this invention, functioning as a GRIN-SCH (graded index separate confinement) laser, in which the active layer is composed of a non-doped GaAs quantum well 32 having a thickness of 60 Å and it is sandwiched between GRIN (graded index) layers 31 and 33, each of which is composed of a non-doped $Al_xGa_{1-x}As$ (wherein the mole fraction x in said mixed crystal is linearly changed from 0.2 to 0.5 as the distance of a portion of said mixed crystal from the quantum well becomes large). This GRIN-SCH laser operates at a low threshold current, 10 mA or less. This laser device can be further provided with an opticalguide layer containing an etching-protective layer therein in the vicinity of the active region, as desired. This laser device can be also provided with multi-quantum wells as an active layer.

Although Examples 1 and 2 disclose only liquid phase epitaxy for the growth of the burying layer, they are not limited thereto. Molecular beam epitaxy can be used, provided that the GaAs etching-protective layer 15 has been selectively removed by thermal etching under As molecular beams upon the GaAs etching-protective layer 15 prior to the growth of the burying layer. Metal-organic chemical vapor deposition can also be used for the growth of the burying layer if a vapor phase etching technique is used together therewith. Moreover, the multi-layered crystal for laser oscillation can be formed not only by molecular beam epitaxy, but also by metal-organic chemical vapor deposition.

For the production of semiconductor laser devices disclosed in the above-mentioned examples, the etching-protective layer 15 is used to control the thickness of the p-cladding layer 14, so that the distribution of the equivalent refractive index parallel to the junction direction can be controlled and a fundamental transverse mode can be attained. These advantages are based on the facts that the thickness of crystal growth layers can be controlled with precision of as thin as 10 Å or less by the use of a crystal growth technique such as molecular beam epitaxy or metal-organic chemical vapor deposition. When the etching-protective layer 15 is formed with a thickness of about 200 521 or less, optical losses of the laser device can be suppressed at a low level. Moreover, if the underlying AlGaAs layers 14 and 33 are exposed to the outside when the burying layer 20 is grown, the liquid phase epitaxial growth of said burying layer 20 will be impossible. Even though molecular beam epitaxy or metal-organic chemical vapor deposition is applied to the growth of said burying layer 20, instead of liquid phase epitaxy, the crystallinity of the resulting burying layer 20 will be extremely poor. Especially, a great amount of distortion occurs in the burying layer near the interface between the burying layer and the underlying AlGaAs layer because an oxide film has been naturally formed on the AlGaAs underlying layer, resulting in deterioration of the laser device. In the above-mentioned examples, the surface of the underlying layer is protected by the etching-protective layer 15 prior to the growth of the burying layer 20, and thus deterioration of the surface of the underlying layer on which the burying layer is grown does not arise. Moreover, the GaAs crystal, which is not as readily oxidized in an atmosphere as the AlGaAs crystal, is used as an etching-protective layer, so that deterioration of the surface of the underlying layer can more effectively prevented.

Although the above-mentioned examples describe only an AlGaAs semiconductor laser device, other semiconductor materials such as InGaAlP, InGaAsP, etc., can also used for the laser device of this invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device, a double-heterostructure multi-layered crystal containing an active layer for laser oscillation and including a striped etching-protective thin layer formed on said double-heterostructure multi-layered crystal, a stripped-mesa mesa multi-layered crystal formed on said striped etching-protective thin layer and includes a cladding layer, and a burying layer formed on said double-heterostructure multi-layered crystal outside outside of both the striped thin layer and the striped-mesa multi-layered crystal, wherein said cladding layer and said burying layer contain aluminum and wherein a ratio of the aluminum mole ratio of said burying layer to the aluminum mole ratio of said cladding layer is at least approximately 1,6, thereby providing refractive index distributions within said active layer corresponding to the inside and the outside of said striped-mesa multi-layered crystal and providing a striped structure functioning as a current path composed of said striped-mesa mult-layered crystal.

2. A double-heterostructure multi-layered crystal for use in a semiconductor laser device, comprising:
   a substrate;
   a buffer layer formed on said substrate;
   a first cladding layer formed on said buffer layer;
   an active layer formed on said first cladding layer;
   a second cladding layer formed on said active layer;
   an etching-protective layer formed on said second cladding layer;
   a cap layer formed on said etching protective layer;
   a cap layer formed on said third cladding layer;
   wherein said substrate, buffer layer, first cladding layer, active layer, and second cladding layer are of substantially equal widths comprising a first width, and said etching-protective layer, third cladding layer, and cap layer are of substantially equal widths comprising a second width which is less than said first width; and further comprising
   a burying layer formed on said second cladding layer;
   a first electrode formed on said cap layer and said burying layer; and
   a second electrode formed on said substrate;
   wherein said burying layer, first electrode and second electrode have widths substantially equal to said first width and wherein each of said burying layer and said third cladding layer contains aluminum, wherein a ratio of the aluminum mole of said burying layer to the aluminum mole ratio of said third cladding layer is at least approximately 1.6.

3. A double-heterostructure multi-layered crystal for use in a semiconductor laser device, comprising:
  a substrate;
  a buffer layer formed on said substrate;
  a first cladding layer formed on said buffer layer;
  a first graded index layer formed on said first cladding layer;
  an active layer formed on said first graded index layer;
  a second graded index layer formed on said active layer;
  an etching-protective layer formed on said second graded index layer;
  a second cladding layer formed on said etching-protective layer;
  a cap layer formed on said second cladding layer;
  wherein said substrate, buffer layer, first cladding layer, first graded index layer, active layer, and second graded index layer are of substantially equal widths comprising a first width, and said etching-protective layer, second cladding layer, and cap layer are of substantially equal widths comprising a second width which is less than said first width; and further comprising
  a burying layer formed on said second graded index layer;
  a first electrode formed on said cap layer and said burying layer; and
  a second electrode formed on said substrate;
  wherein said burying layer, first electrode and second electrode have widths substantially equal to said first width, and wherein each of said burying layer and said third cladding layer contains aluminum, wherein a ratio of the aluminum mole ratio of said burying layer to the aluminum mole ratio of said second cladding layer is at least approximately 1.6.

4. In a GaAs semiconductor laser device, a double-heterostructure multi-layered crystal containing an active layer for laser oscillation and including a striped etching-protective thin layer formeed on said double-heterostructure multi-layered crystal, a striped-mesa multi-layered crystal including a cladding layer containing aluminum, a striped etching-protective thin layer, and a burying layer containing aluminum and formed on said double-heterostructure multi-layered crystal outside of both the striped thin layer and the striped-mesa multi-layered crystal, wherein a ratio of the aluminum mole ratio of said burying layer to the aluminum mole ratio of said cladding layer is at least approximately 1.6, said striped etching-protective thin layer containing no aluminum, thereby providing refractive index distributions within said active layer corresponding to the inside and the outside of said striped-mesa multi-layered crystal and providing a striped structure functioning as a current path composed of said striped-mesa multi-layered crystal.

5. In a semiconductor laser device, a double-heterostructure multi-layered crystal containing an active layer for laser oscillation and including a striped etching-protective thin layer formed on said double-heterostructure multi-layered crystal, a striped-mesa multi-layered crystal formed on said striped etching-protective thin layer and including a cladding layer containing aluminum, and a burying layer containing aluminum and formed on said double-heterostructure multi-layered crystal outside of both the striped thin layer and the striped-mesa multi-layered crystal, wherein each of said burying layer and said cladding layer contains aluminum, wherein a ratio of the aluminum mole ratio of said burying layer to the aluminum mole ratio of the cladding layer is at least approximately 1.6, said striped etching-protective thin layer being approximately 200 A or less in thickness, thereby providing refractive index distributions within said active layer correponding to the inside and the outside of said striped-mesa multi-layered crystal and providing a striped structure functioning as a current path composed of said striped-mesa multi-layered crystal.

* * * * *